(12) United States Patent
Ishiguro

(10) Patent No.: US 8,284,876 B2
(45) Date of Patent: Oct. 9, 2012

(54) AUTOMATIC GAIN CONTROL CIRCUIT

(75) Inventor: Kazuhisa Ishiguro, Ota (JP)

(73) Assignee: Ricoh Co., Ltd., Tokyo (JP)

(*) Notice: Subject to any disclaimer, the term of this patent is extended or adjusted under 35 U.S.C. 154(b) by 1010 days.

(21) Appl. No.: 12/298,358

(22) PCT Filed: Nov. 29, 2006

(86) PCT No.: PCT/JP2006/324320
§ 371 (c)(1),
(2), (4) Date: Oct. 24, 2008

(87) PCT Pub. No.: WO2007/122772
PCT Pub. Date: Nov. 1, 2007

(65) Prior Publication Data
US 2009/0207952 A1 Aug. 20, 2009

(30) Foreign Application Priority Data
Apr. 24, 2006 (JP) .................... 2006-118746

(51) Int. Cl.
*H04L 27/08* (2006.01)
*H04B 1/06* (2006.01)
(52) U.S. Cl. ..................... 375/345; 455/234.1
(58) Field of Classification Search .................. 375/345; 455/232.1, 234.1, 234.2, 249.1, 253.2
See application file for complete search history.

(56) References Cited

U.S. PATENT DOCUMENTS 5,175,883 A * 12/1992 Ueno ................. 455/242.2
2001/0006542 A1 * 7/2001 Ozeki et al. ............. 375/345
2003/0064692 A1 * 4/2003 Shi ........................ 455/232.1
2004/0063413 A1 * 4/2004 Schaffer et al. .......... 455/234.1

FOREIGN PATENT DOCUMENTS

| JP | 10190382 | 7/1998 |
| JP | 11127084 | 5/1999 |
| JP | 2004-007136 A | 1/2004 |
| JP | 2004-096404 A | 3/2004 |
| JP | 2004304568 | 10/2004 |
| JP | 2005020119 | 1/2005 |
| JP | 2005020120 | 1/2005 |
| JP | 2005020302 | 1/2005 |

OTHER PUBLICATIONS

Non-English Office Action issued in related Japanese Application No. 2006-118746 on Jan. 10, 2012.

* cited by examiner

*Primary Examiner* — Betsy Deppe
(74) *Attorney, Agent, or Firm* — Connolly Bove Lodge & Hutz LLP

(57) ABSTRACT

There are provided an A/D converting circuit (10) for converting, into a digital signal, a broadband intermediate frequency signal which is output from a frequency converting circuit (5), and a DSP (11) for generating and outputting control data to control gains of an antenna damping circuit (3) and an LNA (4) based on a level of the broadband digital intermediate frequency signal which is output from the A/D converting circuit (10), and the broadband intermediate frequency signal which is output from the frequency converting circuit (5) is A/D converted and supplied to the DSP (11). Consequently, it is possible to reduce a frequency of a signal input to the A/D converting circuit (10). Thus, it is also possible to reduce a consumed current without requiring the use a special AD converter corresponding to a radio frequency input.

2 Claims, 1 Drawing Sheet

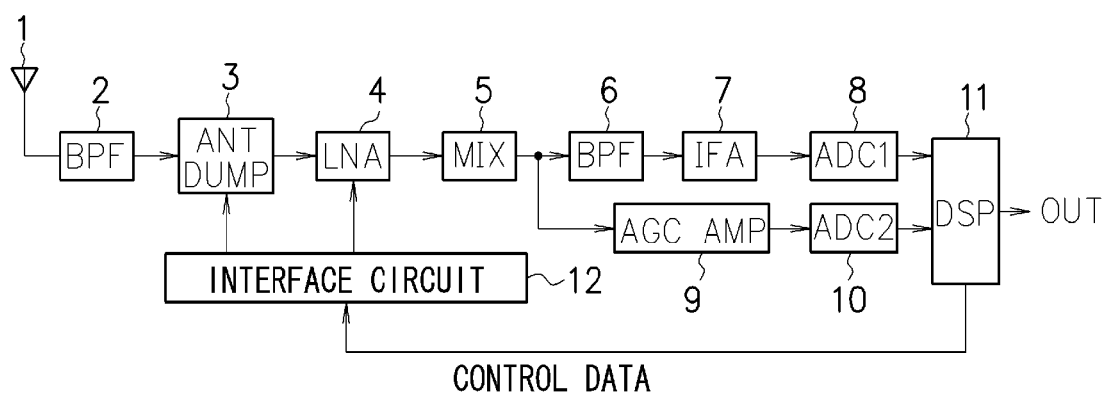

AUTOMATIC GAIN CONTROL CIRCUIT

FIELD OF THE INVENTION

The present invention relates to an automatic gain control circuit, and more particularly to a circuit for carrying out an AGC operation to suppress a distortion of a signal when a strong signal is input to a wireless communicating apparatus such as a radio receiver.

DESCRIPTION OF THE RELATED ART

A wireless communicating apparatus such as a radio receiver is usually provided with an AGC (Automatic Gain Control) circuit for controlling a gain of a received signal. An RF (Radio Frequency) AGC circuit serves to control a gain of a radio frequency signal (an RF signal) received by an antenna and to maintain a level of the received signal to be constant. The RF-AGC can be implemented by controlling a quantity of attenuation in an antenna damping circuit or a gain of an LNA (Low Noise Amplifier) or the like.

The RF-AGC circuit is not operated when an electric field strength of an antenna input signal is not greater than a threshold, and does not reduce the gain of the received signal. However, when a signal having a strong electric field is input to an antenna so that the electric field strength exceeds the threshold, the RF-AGC circuit is operated to reduce the gain of the received signal, thereby preventing an excessive power from being applied to the wireless communicating apparatus.

Conventionally, there has been proposed a technique for executing AGC processings of an antenna damping circuit and an LNA as digital signal processings by using a DSP (Digital Signal Processor) (for example, see Patent Document 1). In the technique described in the Patent Document 1, a level of a broadband RF signal which is output from the LNA, a level of an intermediate-band IF signal which is output from an IF (Intermediate Frequency) amplifier and a level of a narrowband IF signal which is output from an IF filter are detected respectively and are converted into digital signals, and the DSP determines a possibility of a gain control of the antenna damping circuit and the LNA and a quantity of the gain control based on a signal level of each band.

Patent Document 1: WO2005/053171 Publication

DISCLOSURE OF THE INVENTION

However, in the technique described in the Patent Document 1, the RF signal output from the LNA is used to detect the broadband signal level. Accordingly, a frequency of a signal input to an AD converter for A/D converting the RF signal is increased. For this reason, there is a problem in that a special AD converter capable of corresponding to a high input frequency is to be used. Moreover, there is a problem in that a consumed current in the AD converter is also increased.

In order to solve the problems, it is an object of the present invention to enable an execution of an AGC processing through a DSP with a small consumed current without using a special AD converter corresponding to a radio frequency input.

In order to attain the object, an automatic gain control circuit according to the present invention A/D converts a broadband intermediate frequency signal which is output from a frequency converting circuit and supplies the signal thus A/D converted to a digital signal processing portion, thereby controlling a gain of a received radio frequency signal based on a level of the broadband intermediate frequency signal.

According to the present invention having the structure described above, a broadband signal which includes both a desirable wave and a disturbing wave is converted from a signal in a radio frequency band into a signal in an intermediate frequency band and the signal thus converted is supplied to an A/D converting portion. Therefore, it is possible to reduce a frequency of the signal input to the A/D converting portion. Therefore, it is also possible to reduce a consumed current without requiring to use a special AD converter corresponding to a radio frequency input.

BRIEF DESCRIPTION OF THE DRAWINGS

FIG. 1 is a diagram showing an example of a structure of a radio receiver executing an automatic gain control circuit according to the present invention.

BEST MODE FOR CARRYING OUT THE INVENTION

An embodiment according to the present invention will be described below with reference to the drawings. FIG. 1 is a diagram showing an example of a structure of a radio receiver executing an automatic gain control circuit according to the present invention. As shown in FIG. 1, the radio receiver according to the present embodiment includes an antenna 1, a band-pass filter (BPF) 2, an antenna damping circuit 3, an LNA 4, a frequency converting circuit 5, a BPF 6, an IF amplifier 7, a first A/D converting circuit 8, an AGC amplifier 9, a second A/D converting circuit 10, a DSP 11, and an interface circuit 12. These structures (excluding the antenna 1) are integrated into a single semiconductor chip through a CMOS (Complementary Metal Oxide Semiconductor) process, for example.

The BPF 2 selectively outputs a broadcast wave signal in a specific frequency band from broadcast wave signals received by the antenna 1. The BPF 2 has a comparatively broad pass band and causes a broadcast signal including a desirable band to pass therethrough. The antenna damping circuit 3 controls a radio frequency signal passing through the BPF 2 into an attenuation degree which is variably set in response to a control signal supplied from the interface circuit 12. The LNA 4 corresponds to a radio frequency amplifying circuit according to the present invention and amplifies a radio frequency signal passing through the BPF 2 with a low noise. A gain of the LNA 4 is controlled in response to the control signal supplied from the interface circuit 12.

When an antenna input signal does not have a very great receiving strength, the antenna damping circuit 3 is not operated so that the level of the received signal is not attenuated. The gain of the LNA 4 is also set to be a maximum gain. However, when a signal having a strong electric field is input to the antenna 1, the gain of the LNA 4 is first reduced (an amplifying gain is caused to approximate to be zero ([dB]) to attenuate the received signal. In the case in which a quantity of the attenuation is still insufficient, the gain of the antenna damping circuit 3 is reduced (the gain is attenuated to be equal to or smaller than zero [dB]). Consequently, an occurrence of a distortion is improved in such a manner that the electric field strength of the received signal does not exceed a dynamic range of the circuit.

A signal amplified by the LNA 4 is supplied to the frequency converting circuit 5. The frequency converting circuit 5 mixes the radio frequency signal supplied from the LNA 4 with a local oscillating signal supplied from a local oscillating circuit which is not shown, and carries out a frequency conversion to generate and output an intermediate frequency signal. The BPF 6 carries out a band limitation for the intermediate frequency signal supplied from the frequency converting circuit 5, thereby extracting a narrowband intermediate frequency signal including only one station of a desirable frequency.

The IF amplifier 7 amplifies the narrowband intermediate frequency signal (including only a desirable wave) which is output from the BPF 6. The first A/D converting circuit 8 analog-digital converts the intermediate frequency signal output from the IF amplifier 7. The intermediate frequency signal thus converted into digital data is input to the DSP 11. The DSP 11 demodulates, into a baseband signal, a narrowband digital intermediate frequency signal which is input from the first A/D converting circuit 8 and outputs the baseband signal.

The AGC amplifier 9 corresponds to an amplifying circuit according to the present invention and amplifies a broadband intermediate frequency signal (including both a desirable wave and a disturbing wave) which is output from the frequency converting circuit 5. The second A/D converting circuit 10 corresponds to an A/D converting portion according to the present invention and analog-digital converts the intermediate frequency signal output from the AGC amplifier 9. The intermediate frequency signal thus converted into the digital data is input to the DSP 11.

The DSP 11 corresponds to a digital signal processing portion according to the present invention, and detects a level of the narrowband digital intermediate frequency signal which is input from the first A/D converting circuit 8 and detects a level of the broadband digital intermediate frequency signal which is input from the second A/D converting circuit 10, and generates control data for controlling gains of the antenna damping circuit 3 and the LNA 4 corresponding to the detected levels. Then, the control data are output to the interface circuit 12.

The interface circuit 12 generates a control signal for controlling the gains of the antenna damping circuit 3 and the LNA 4 based on the control data supplied from the DSP 11 and supplies the control signal to the antenna damping circuit 3 and the LNA 4. Consequently, the gains of the antenna damping circuit 3 and the LNA 4 are controlled.

For example, if an AGC range is set to be 60 [dB], the gain is reduced by a maximum of 20 [dB] in the LNA 4 corresponding to the level of the broadband digital intermediate frequency signal when a level VD of the narrowband digital intermediate frequency signal is smaller than a predetermined value D. When the level VD of the narrowband digital intermediate frequency signal band is greater than the predetermined value D and the level of the broadband digital intermediate frequency signal is also greater than a predetermined value UD, the quantity of attenuation becomes insufficient even through a reduction in the gain of the LNA 4 by 20 [dB]. In this case, the antenna damping circuit 3 carries out the attenuation corresponding to a maximum of 40 [dB] in response to the level of the broadband digital intermediate frequency signal.

As described above in detail, according to the present embodiment, the intermediate frequency signal of the broadband which is output from the frequency converting circuit 5 is A/D converted through the second A/D converting circuit 10 and the signal thus A/D converted is supplied to the DSP 11 to control the gain of the radio frequency signal received by the antenna 1 based on the level of the intermediate frequency signal of the broadband. For example, by setting a frequency band of the broadband intermediate frequency signal to be approximately several hundreds KHz, it is possible to reduce the frequency of the signal input to the second A/D converting circuit 10. Therefore, it is also possible to reduce a consumed current without requiring to use a special AD converter corresponding to a radio frequency input.

According to the present embodiment, referring to the AGC amplifier 9 provided between the frequency converting circuit 5 and the second A/D converting circuit 10, it is also possible to reduce the frequency of the input signal. Therefore, the AGC amplifier 9 can be constituted by a feedback amplifier capable of determining the gain at a resistance ratio. Consequently, it is possible to improve a characteristic with respect to a variation in a gain and a change in an environment. Thus, an AGC characteristic can be improved.

Although the description has been given to the example in which the gains of the antenna damping circuit 3 and the LNA 4 are controlled in the embodiment, the present invention is not restricted thereto. For example, it is also possible to further control the gain of the frequency converting circuit 5 by outputting a control signal from the interface circuit 12 to the frequency converting circuit 5.

Although the intermediate frequency signal of the narrow band is generated from the intermediate frequency signal of the broadband through the BPF 6 in the embodiment, furthermore, the present invention is not restricted thereto. For example, it is also possible to generate an intermediate frequency signal of an intermediate-band from the intermediate frequency signal of the broadband through the BPF and to generate an intermediate frequency signal of a narrowband from the intermediate frequency signal of the intermediate-band through the BPF 6. In this case, it is also possible to A/D convert the intermediate frequency signal of the intermediate band and to supply the A/D converted signal to the DSP 11, thereby controlling the gain in consideration of a level of the signal.

In addition, the embodiment is only illustrative for carrying out the present invention and the technical range of the present invention should not be construed to be restrictive. In other words, the present invention can be carried out in various forms without departing from the spirit or main features thereof.

INDUSTRIAL APPLICABILITY

The present invention is useful for an automatic gain control circuit including a radio frequency amplifying circuit and an attenuating circuit which have variable gains. The automatic gain control circuit can be applied to a wireless communicating apparatus such as a radio receiver, a television receiver or a portable telephone.

What is claimed is:

1. An automatic gain control circuit, comprising:
   an antenna damping circuit to attenuate a broadband radio frequency signal of a received broadcast signal by a gain which is variably controlled;
   a radio frequency amplifying circuit to amplify the radio frequency signal from the antenna damping circuit by the variably controlled gain;
   a frequency converting circuit to generate and output a broadband intermediate frequency signal by carrying out a frequency conversion with respect to the amplified radio frequency signal by the radio frequency amplifying circuit;
   a band-pass filter to extract and output a narrowband intermediate frequency signal by carrying out a band limitation with respect to the broadband intermediate frequency signal;
   a first analog-to-digital (A/D) converting portion to convert the narrowband intermediate frequency signal into a narrowband digital intermediate frequency signal and output the narrowband digital intermediate frequency signal;

a second A/D converting portion to convert the broadband intermediate frequency signal into a broadband digital intermediate frequency signal and output the broadband digital intermediate frequency signal;

a digital signal processing portion to detect a level of the narrowband digital intermediate frequency signal and a level of the broadband digital intermediate frequency signal and to output control data according to a magnitude of the levels of the narrowband digital intermediate frequency signal and the broadband digital intermediate frequency signal that are detected; and a circuit to control gains of the antenna damping circuit and the radio frequency amplifying circuit based on the control data according to the magnitude of the levels of the narrowband digital intermediate frequency signal and the broadband digital intermediate frequency signal, wherein the control circuit is configured to perform a control in which, when the level of the narrowband digital intermediate frequency signal is smaller than a first predetermined value, the gain of the radio frequency amplifying circuit is reduced according to the broadband digital intermediate frequency signal, and in which, when the level of the narrowband digital intermediate frequency signal is greater than the first predetermined value and the level of the broadband digital intermediate frequency signal is greater than a second predetermined value, the gain of the radio frequency amplifying circuit is reduced and the gain of the antenna damping circuit is reduced according to the level of the broadband digital intermediate frequency circuit.

2. The automatic gain control circuit according to claim 1, further comprising:

an amplifying circuit to amplify the broadband intermediate frequency signal, wherein the second A/D converting portion is configured to convert the broadband intermediate frequency signal amplified by the amplifying circuit into a digital signal.

* * * * *